(12) United States Patent
Takeda

(10) Patent No.: US 9,991,195 B2
(45) Date of Patent: Jun. 5, 2018

(54) SEMICONDUCTOR DEVICE

(71) Applicant: Renesas Electronics Corporation, Koutou-ku, Tokyo (JP)

(72) Inventor: Hiromitsu Takeda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

(21) Appl. No.: 15/411,582

(22) Filed: Jan. 20, 2017

(65) Prior Publication Data

US 2017/0133312 A1 May 11, 2017

Related U.S. Application Data

(63) Continuation of application No. 14/972,185, filed on Dec. 17, 2015, now Pat. No. 9,589,882.

(30) Foreign Application Priority Data

Dec. 25, 2014 (JP) ................................ 2014-263487

(51) Int. Cl.
*H01L 23/48* (2006.01)
*H01L 23/498* (2006.01)
(Continued)

(52) U.S. Cl.
CPC .... *H01L 23/49838* (2013.01); *H01L 23/3128* (2013.01); *H01L 23/49816* (2013.01);
(Continued)

(58) Field of Classification Search
CPC ......... H01L 23/49838; H01L 23/49827; H01L 24/09; H01L 2224/04042
(Continued)

(56) References Cited

U.S. PATENT DOCUMENTS 4,437,141 A * 3/1984 Prokop ............. H01L 23/49827
174/262
6,137,168 A * 10/2000 Kirkman ........... H01L 23/49827
257/691

(Continued)

FOREIGN PATENT DOCUMENTS

JP 11-163201 A 6/1999
JP 2005-079129 A 3/2005
(Continued)

OTHER PUBLICATIONS

Office Action dated Jan. 23, 2018, in Japanese Patent Application No. 2014-263487.

*Primary Examiner* — Nitin Parekh
(74) *Attorney, Agent, or Firm* — Shapiro, Gabor and Rosenberger, PLLC

(57) ABSTRACT

The semiconductor device includes a wiring substrate having a plurality of ball lands formed on a lower surface of a core layer, a solder resist film covering the lower surface of the core layer, a via conductor layer penetrating the core layer and connected to the ball lands, and an upper surface wiring formed on the upper surface of the core layer, the upper surface wiring having one end formed as a bonding land and the other end connected to the via conductor layer. The semiconductor device further includes a semiconductor chip arranged on the wiring substrate, a solder ball connected to the ball lands. The solder resist film has an eliminating portion that exposes the lower surface of the core layer, and the upper surface wiring has a thin-wire portion and a thick-wire portion, and when seen in a plan view, the thick-wire portion overlaps the eliminating portion.

7 Claims, 6 Drawing Sheets

(51) Int. Cl.
*H01L 23/00* (2006.01)
*H01L 23/31* (2006.01)
*H01L 21/48* (2006.01)

(52) U.S. Cl.
CPC ........ *H01L 23/49827* (2013.01); *H01L 24/05* (2013.01); *H01L 24/48* (2013.01); *H01L 24/49* (2013.01); *H01L 21/4846* (2013.01); *H01L 24/45* (2013.01); *H01L 2224/04042* (2013.01); *H01L 2224/32225* (2013.01); *H01L 2224/45144* (2013.01); *H01L 2224/45147* (2013.01); *H01L 2224/48106* (2013.01); *H01L 2224/48227* (2013.01); *H01L 2224/48465* (2013.01); *H01L 2224/73265* (2013.01); *H01L 2924/00014* (2013.01); *H01L 2924/01028* (2013.01); *H01L 2924/01029* (2013.01); *H01L 2924/01079* (2013.01); *H01L 2924/0665* (2013.01); *H01L 2924/10161* (2013.01); *H01L 2924/10253* (2013.01); *H01L 2924/13091* (2013.01); *H01L 2924/1515* (2013.01); *H01L 2924/1579* (2013.01); *H01L 2924/15183* (2013.01); *H01L 2924/15311* (2013.01); *H01L 2924/15738* (2013.01); *H01L 2924/181* (2013.01); *H01L 2924/186* (2013.01); *H01L 2924/3512* (2013.01)

(58) Field of Classification Search
USPC ........................................................ 257/774
See application file for complete search history.

(56) References Cited

U.S. PATENT DOCUMENTS

| | | | |
|---|---|---|---|
| 6,897,555 | B1 * | 5/2005 | Lim ........................ H01L 23/50 |
| | | | 257/691 |
| 7,479,705 | B2 | 1/2009 | Takahashi |
| 8,076,787 | B2 | 12/2011 | Hayashi |
| 8,823,177 | B2 | 9/2014 | Tsuge |
| 8,836,149 | B2 | 9/2014 | Son |
| 2002/0171145 | A1 | 11/2002 | Higuchi |
| 2006/0157865 | A1 | 7/2006 | Hokari |
| 2006/0180943 | A1 | 8/2006 | Miwa |
| 2006/0279315 | A1 * | 12/2006 | Takagi ................. G01R 1/0491 |
| | | | 257/773 |
| 2009/0294978 | A1 | 12/2009 | Ota |
| 2011/0001239 | A1 * | 1/2011 | Hsieh ............... H01L 23/49816 |
| | | | 257/738 |
| 2012/0187564 | A1 | 7/2012 | Tsuge |
| 2014/0001648 | A1 | 1/2014 | Nakamura |
| 2014/0124941 | A1 | 5/2014 | Sakamoto |

FOREIGN PATENT DOCUMENTS

| | | |
|---|---|---|
| JP | 2006-140512 A | 6/2006 |
| JP | 2014-082299 A | 5/2014 |
| WO | WO 2013-057867 A1 | 4/2015 |

* cited by examiner

SEMICONDUCTOR DEVICE

CROSS-REFERENCE TO RELATED APPLICATION

The present application claims priority from Japanese Patent Application No. 2014-263487 filed on Dec. 25, 2014, the content of which is hereby incorporated by reference into this application.

TECHNICAL FIELD OF THE INVENTION

The present invention relates to a semiconductor device and particularly to a technique applied effectively to a semiconductor device including a semiconductor chip mounted on a wiring substrate.

BACKGROUND OF THE INVENTION

The abstract of Japanese Patent Application Publication Laid-Open No. 2005-79129 (Patent Document 1) discloses a plastic package 10 including first extension lines 18 short-circuiting a plurality of second conductor wiring patterns 17a not connected to a plating extension line 16, a tie-line 19 connecting the first extension lines 18 with each other, and a first conductor wiring pattern 17 connected to the plating extension line 16 via a second extension line 18a. In a state that the first conductor wiring pattern 17 is connected to the tie-line 19, electroplating is performed to form an electroplating film 15 on the second conductor wiring patterns 17a via the first conductor wiring pattern 17. Following the formation of the electroplating film 15, the tie-line 19 is eliminated at an eliminating portion 21 to disconnect the second conductor wiring patterns 17a from each other.

The paragraphs [0010] and [0012] of Japanese Patent Application Publication Laid-Open No. 2014-82299 (Patent Document 2) disclose a configuration in which, in order to prevent the cracking of a semiconductor chip that happens when an etch-back trench (equivalent to "eliminating portion 21" of Patent Document 1) crosses the semiconductor chip, the etch-back trench crossing the semiconductor chip is divided into separate trenches in an inner area of the semiconductor chip.

SUMMARY OF THE INVENTION

The inventor of the present invention has examined a BGA (Ball Grid Array) type semiconductor device and found the following problems.

The BGA (Ball Grid Array) type semiconductor device examined by the inventor includes a wiring substrate, a semiconductor chip mounted on the upper surface of the wiring substrate, an upper surface wiring and a plurality of bonding lands that are formed on the upper surface of the wiring substrate, a plurality of wires connecting bonding pads of the semiconductor chip to the bonding lands, and a sealing material covering the upper surface of the wiring substrate, the semiconductor chip and the plurality of wires. The semiconductor device also includes a plurality of ball lands formed on the lower surface of the wiring substrate and solder balls connected to the plurality of ball lands. The plurality of bonding lands and ball lands has their surfaces coated with a plating film made of nickel and gold by electroplating. In the same manner as in Patent Document 1 or 2, however, following the formation of the plating film, tie-lines are eliminated at eliminating portions (etch-back trenches, openings). The eliminating portions are arranged in an area on the lower surface of the wiring substrate in which area no ball land is arranged. Each of the eliminating portions is of a rectangle whose long sides extend along sides of the wiring substrate. Different from the case of Patent Document 2, the eliminating portions (etch-back trenches) are arranged in an inner area or outer area of the semiconductor chip such that the eliminating portions do not cross a side of the semiconductor chip.

The examination by the inventor has revealed that a problem of breakage of the upper surface wiring of the wiring substrate occurs during a temperature cycle test carried out on the semiconductor device. The temperature cycle test is a reliability test by which whether the semiconductor device withstands a temperature change that may occur during storage, transportation, or use of the device is verified. During the test, the semiconductor device is alternately subjected to a lowest temperature and a highest temperature a given times (cycles). At one temperature cycle, the storage temperature of the semiconductor device is changed in order of "ordinary temperature, lowest temperature, ordinary temperature, highest temperature, ordinary temperature". The temperature cycle test is conducted under conditions of, for example, the lowest temperature being −60 degrees C., the highest temperature being 150 degrees C., and the number of temperature cycles being 300.

The wiring substrate is composed of a core layer, an upper surface wiring and a lower surface wiring that are formed on both surfaces (upper and lower surfaces) of the core layer, respectively, and a solder resist film covering the upper surface wiring and the lower surface wiring. On the lower surface of the wiring substrate, rectangular eliminating portions are formed as openings on the solder resist film.

During the above temperature cycle test, the wiring substrate and the semiconductor chip expand and contract repeatedly. As a result, due to a difference in a thermal expansion coefficient between the wiring substrate and the semiconductor chip, a stress develops at the wiring substrate. This stress concentrates on a corner of a rectangular eliminating portion, causing a crack on the solder resist film at the corner. Then, another crack develops at the core layer of the wiring substrate along a long side of the rectangular eliminating portion. This crack of the core layer reaches the upper surface wiring, thus breaking the upper surface wiring. In short, the upper surface wiring located above (i.e., overlapping or crossing) the eliminating portion when seen in a plan view breaks, which is the problem found to be occurring during the temperature cycle test. It has also been found that the breakage of the upper surface wiring is frequently caused by an eliminating portion overlapping the semiconductor chip when seen in a plan view.

The object of the present invention is to prevent the breakage of an upper surface wiring of a wiring substrate, thereby providing a highly reliable semiconductor device.

The above and other objects and novel characteristics of the present invention will be apparent from the description of the present specification and the accompanying drawings.

The following is a brief description of an outline of the typical invention disclosed in the present application.

A semiconductor device according to one aspect of the present invention includes a wiring substrate having a plurality of ball lands formed on a lower surface of a core layer, a solder resist film covering the lower surface of the core layer, a via conductor layer penetrating the core layer and connected to the ball lands, and an upper surface wiring formed on an upper surface of the core layer, the upper surface wiring having one end formed as a bonding land and the other end connected to the via conductor layer. The semiconductor device also includes a semiconductor chip arranged on the wiring substrate and a solder ball connected to the ball lands. The solder resist film has an eliminating portion exposing the lower surface of the core layer. The upper surface wiring has a thin-wire portion and a thick-wire portion, and the thick-wire portion overlaps the eliminating portion when seen in a plan view.

Among the inventions disclosed in the application, the advantageous effects obtained by the representatives will be briefly explained as below.

That is, according to one aspect of the present invention, it is possible to improve the reliability of a semiconductor device.

BRIEF DESCRIPTIONS OF THE DRAWINGS

DESCRIPTIONS OF THE PREFERRED EMBODIMENTS

Figure 1:
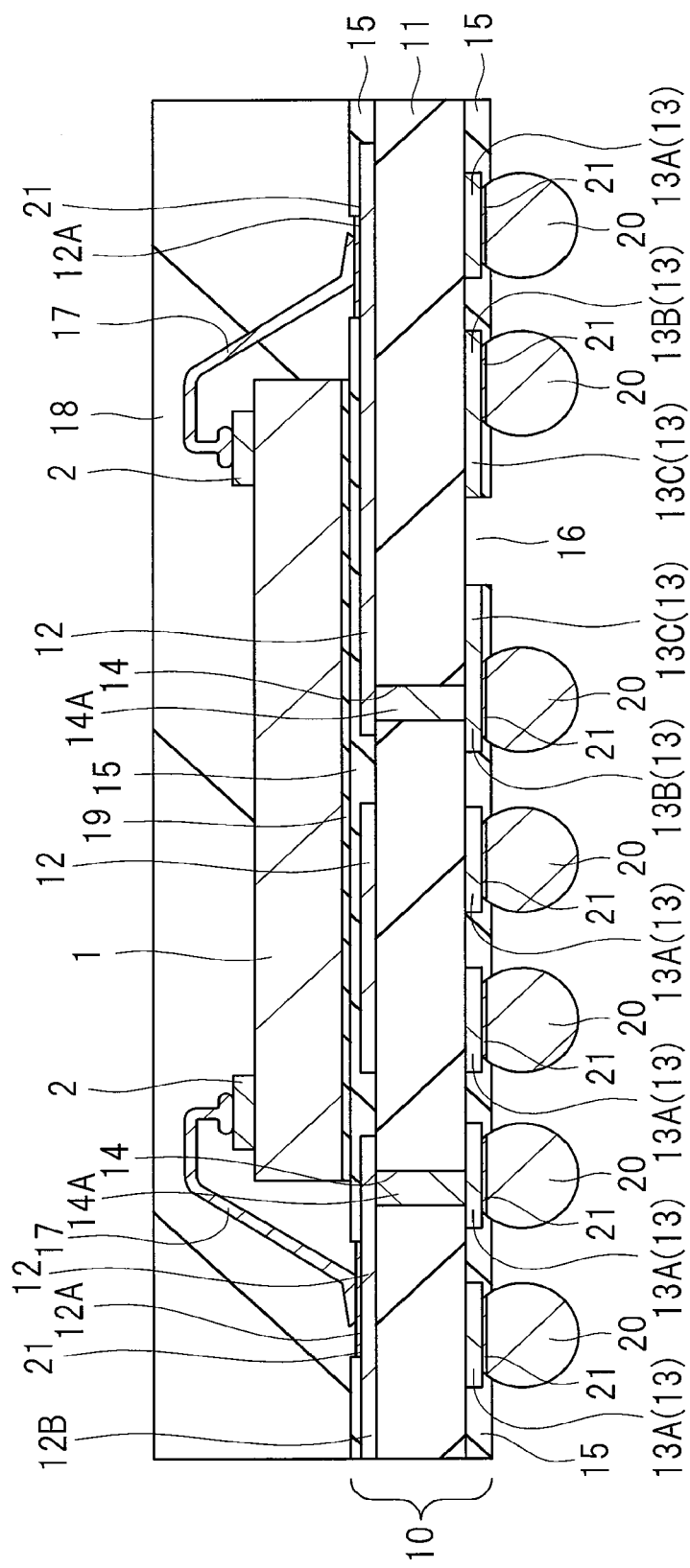
FIG. 1 is a cross-sectional view of main parts of a semiconductor device according to an embodiment of the present invention.

Explanation of Description Form, Basic Terms, and Usage in the Present Application In the present application, the embodiments are described in a plurality of sections or others when required as a matter of convenience. However, these sections or others are not independent from each other unless otherwise stated, and the one in each portion of single example relates to the entire, a part, or a partial detail of the other as a modification example or others regardless of the described context. Also, in principle, the repetitive description of the similar portions is omitted. Further, the number of each element in the embodiments is not always limited to a specific number unless otherwise stated or except the case where the number is logically limited to the specific number or except the case where the number is apparently not the specific number from the context.

Similarly, in the description of the embodiments or others, when "X formed of A" is described for a material, composition, or others, the one containing other components than A is not eliminated unless otherwise stated or except the case where it is apparently not so. For example, when a component is described, it means such as "X containing A as a principal component". For example, even when a "silicon member" or others is described, it goes without saying that it includes not only pure silicon but also SiGe (silicon germanium) alloy, multi metal alloy containing other silicon as the principal component, and a member containing other additives or others. In addition, even when gold plating, Cu layer, nickel plating, and others are described, they include not only pure materials but also a member containing gold, Cu, nickel, and others as the principal component, respectively, unless otherwise stated or except the case where they are apparently not so.

Still further, even when referring to the specified number or amount, the number may be larger or smaller than the specified number unless otherwise stated, except the case where the number is logically limited to the specified number, or except the case where it is apparently not so from the context.

Moreover, the same or similar components are denoted by the same or similar reference symbols or reference numbers throughout each drawing of the embodiments, and the repetitive description thereof will be omitted in principle.

In addition, in accompanying drawings, hatching or others may be omitted even in a cross section in the case that the drawing is adversely complicated or the case that a portion is distinct from an empty space. Regarding this, an outline of background is omitted even in a closed hole in a plan view in some cases such that it is clear from explanations or others. Further, even not in the cross-sectional surface, hatching or dot pattern may be added in order to clarify that it is not the empty space, or in order to clearly illustrate a boundary of regions.

Embodiment

Figure 2:
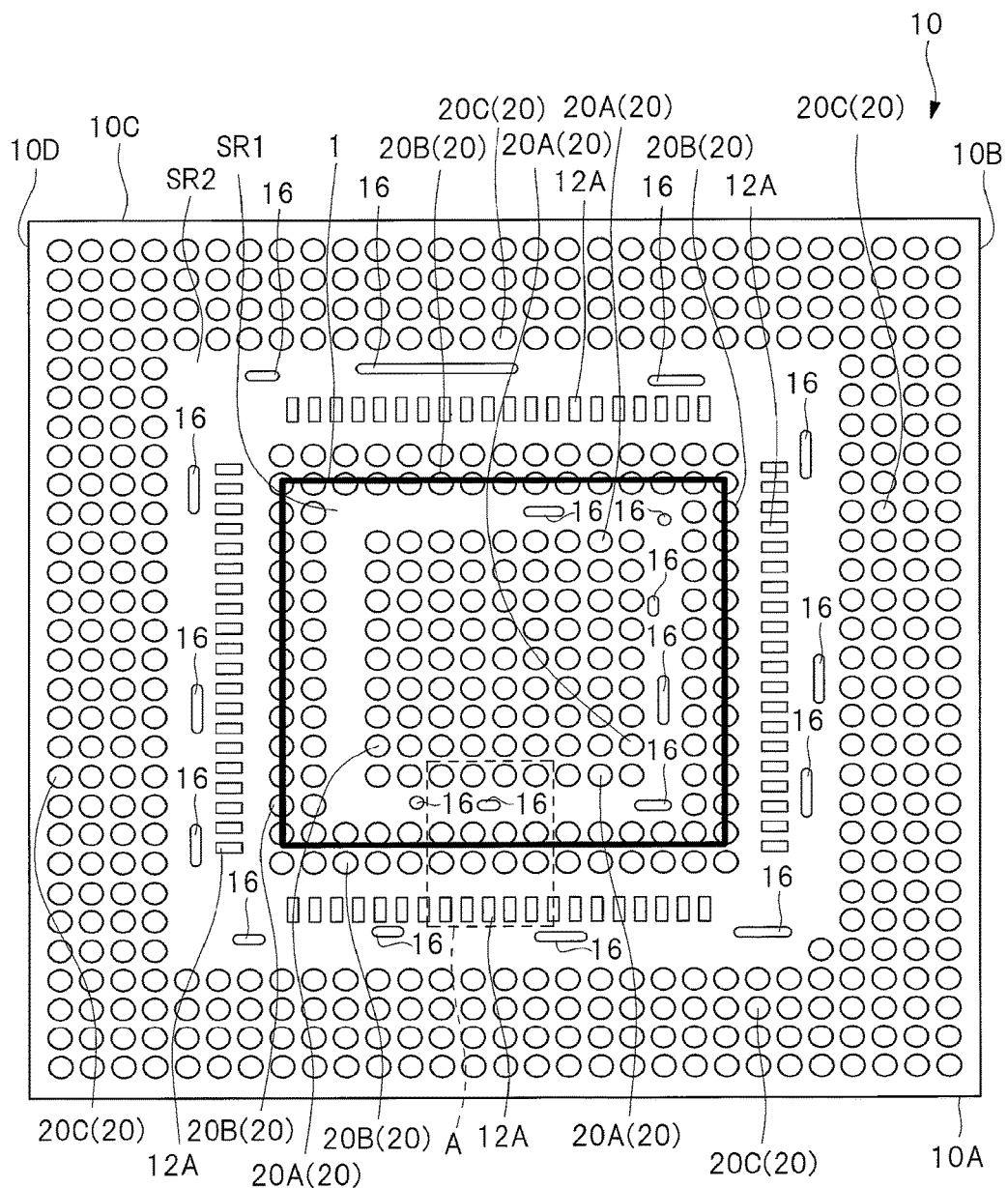
FIG. 2 is a plan view of the main parts of the semiconductor device according to the embodiment of the present invention.
Figure 3:
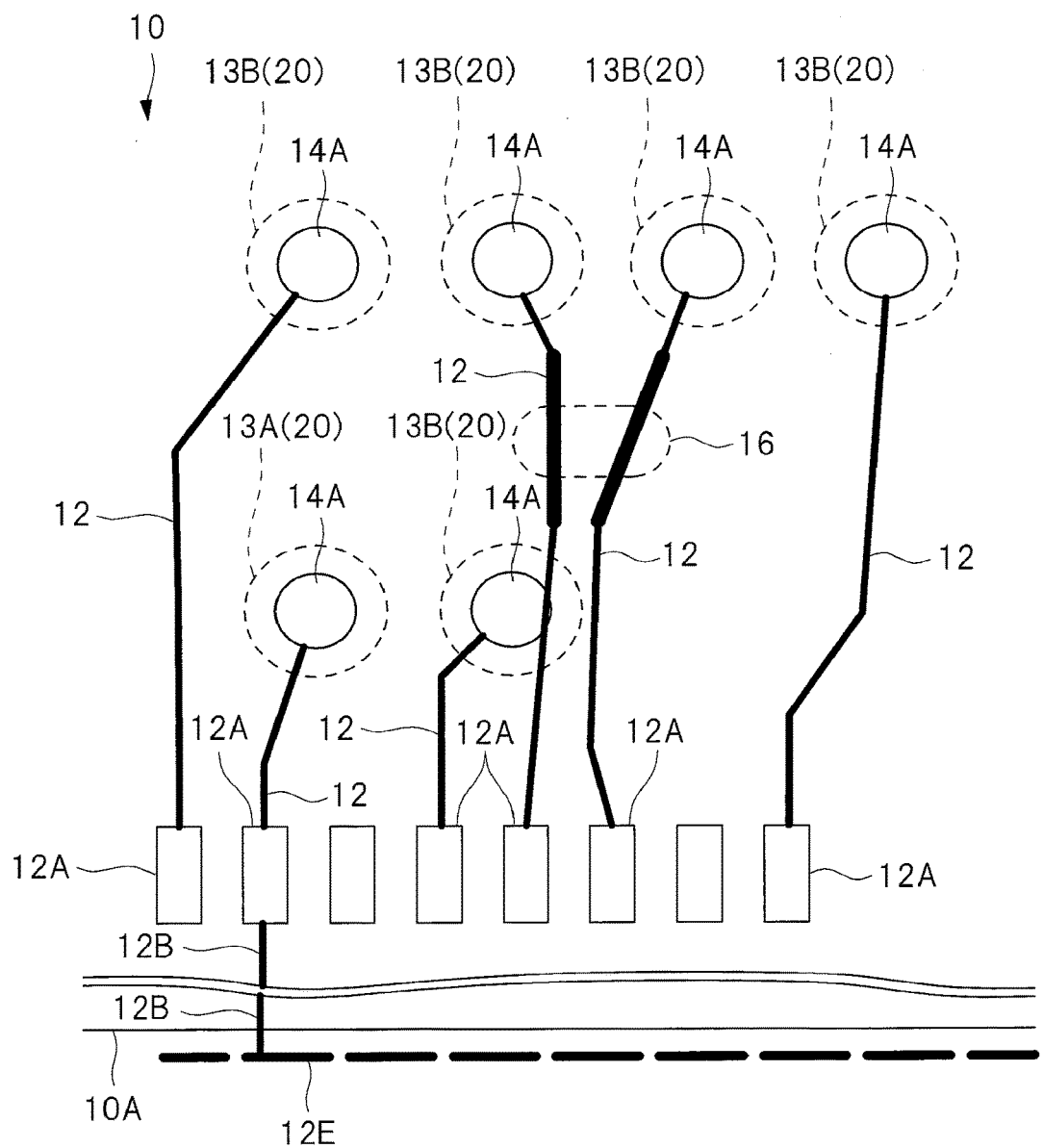
FIG. 3 is an enlarged plan view of main parts of an A section of FIG. 2.
Figure 4:
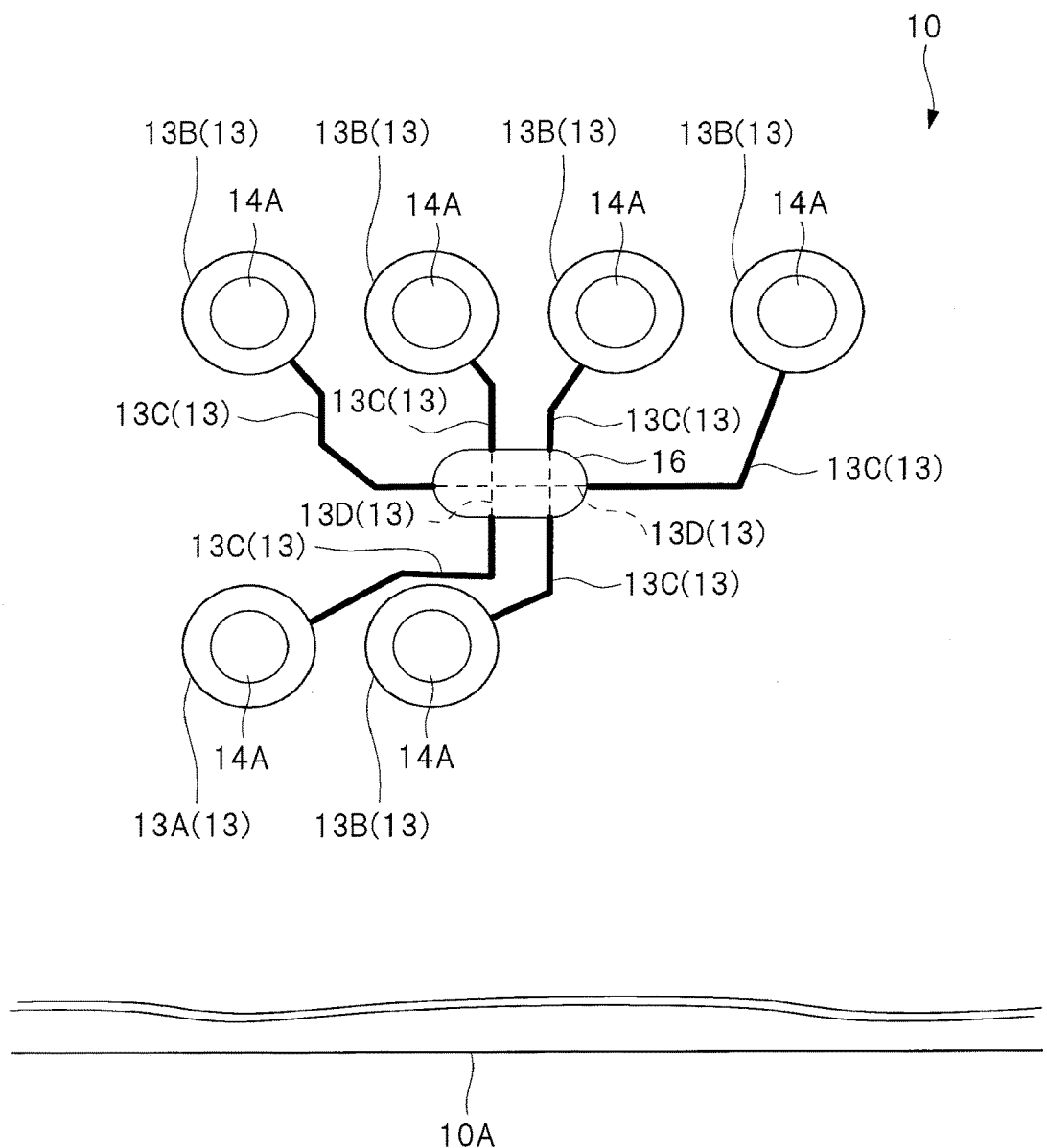
FIG. 4 is an enlarged plan view of the main parts of an A section of FIG. 2.
Figure 5:
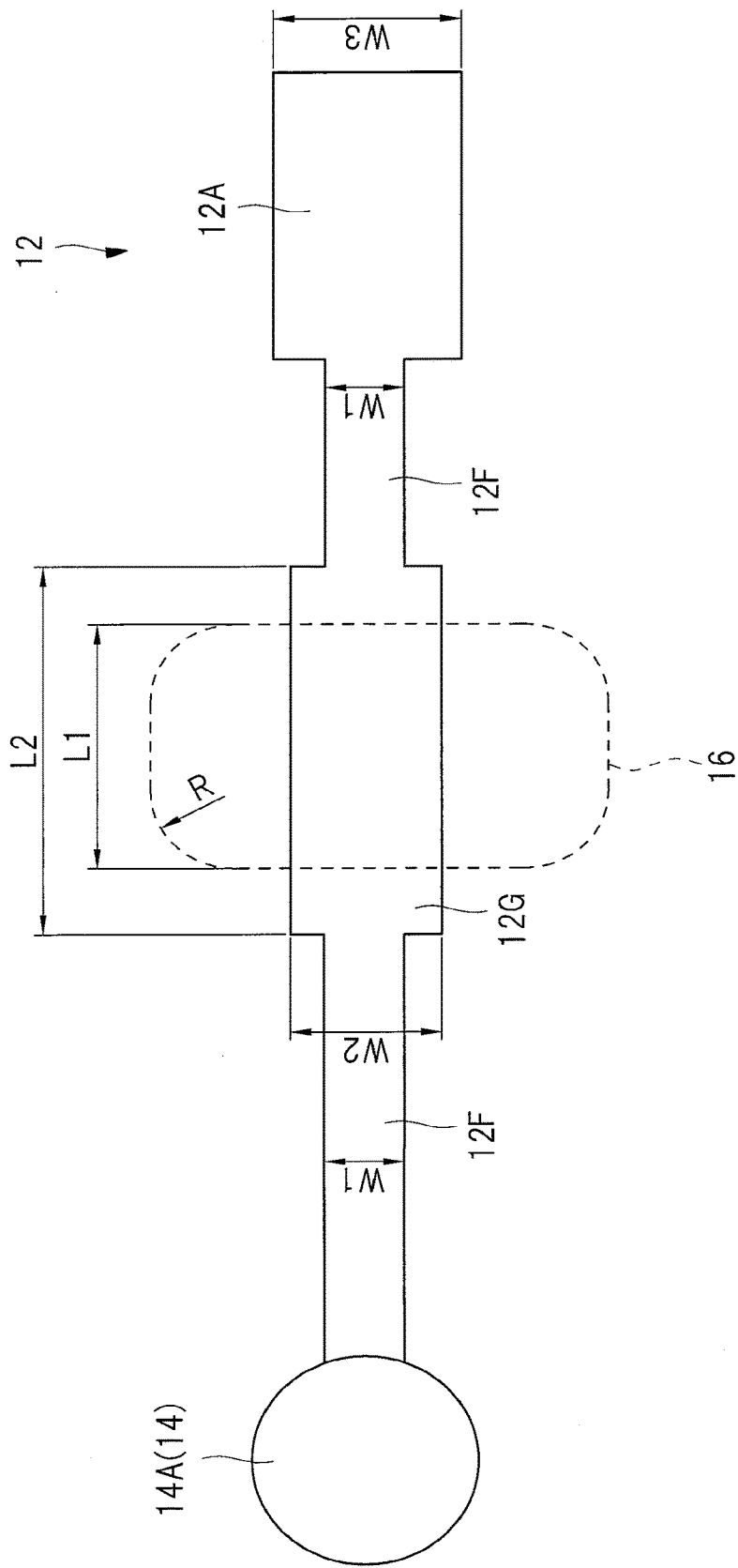
FIG. 5 is an enlarged view of main parts of an upper surface wiring of FIG. 3.
Figure 6:
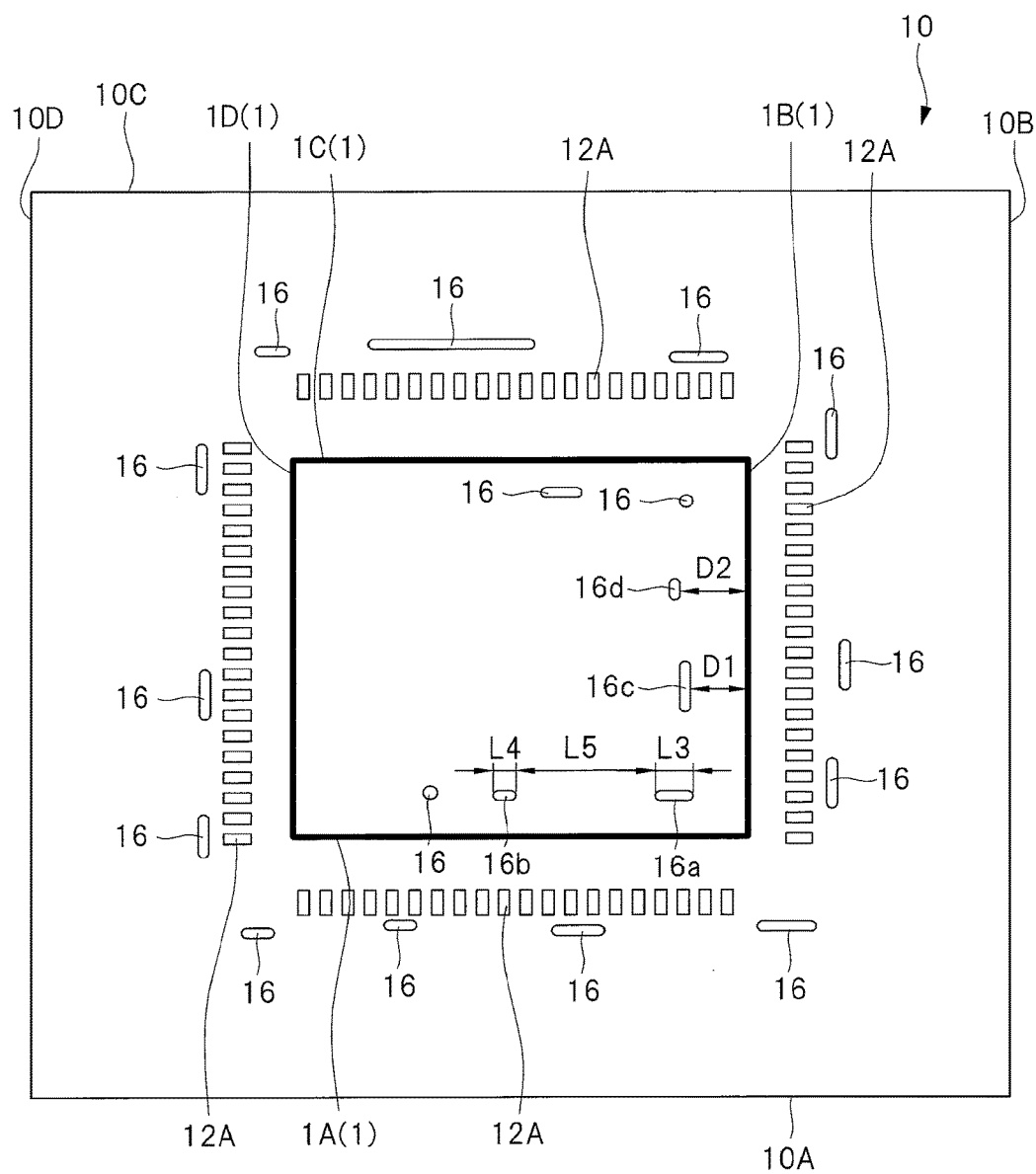
FIG. 6 is a plan view of the main parts of the semiconductor device according to the embodiment of the present invention.

An embodiment of the present invention applied to a BGA type semiconductor device (semiconductor integrated circuit device) will be described. FIG. 1 is a cross-sectional view of main parts of a semiconductor device according to the embodiment, FIG. 2 is a plan view of the main parts of the semiconductor device according to the embodiment, and FIGS. 3 and 4 are enlarged plan views of main parts of an A section of FIG. 2. FIG. 5 is an enlarged view of main parts of an upper surface wiring of FIG. 3, and FIG. 6 is a plan view of the main parts of the semiconductor device according to the embodiment, showing arrangement of a semiconductor chip and eliminating portions when seen in a plan view.

The semiconductor device of the embodiment includes a wiring substrate 10, a semiconductor chip 1 mounted on the upper surface of the wiring substrate 10, a plurality of wires 17 electrically connecting the semiconductor chip 1 to the wiring substrate 10, a sealing material (sealing resin) 18 sealing the semiconductor chip 1 and wires 17, and a plurality of solder balls (external terminals) 20 connected to the lower surface of the wiring substrate 10.

The wiring substrate 10 of the semiconductor device will first be described, referring to FIG. 1. The wiring substrate 10 includes a core layer (insulating layer or core insulating layer) 11 having an upper surface (chip mounting surface or surface) and a lower surface (mounting surface or back surface) located opposite to the upper surface. The core layer 11 is, for example, a resin board containing a glass epoxy resin serving as an insulating layer. The wiring substrate 10 has upper surface wirings 12 formed on the upper surface of the core layer 11 and lower surface wirings 13 formed on the lower surface of the core layer 11. The upper surface wirings 12 and lower surface wirings 13 are covered with solder resist films (organic insulating films) 15, respectively. In the core layer 11, vias 14 are formed such that they penetrate the core layer 11 from its upper surface to lower surface. A via conductor layer 14A is formed in each via 14, where the via conductor layer 14A electrically connects an upper surface wiring 12 to a lower surface wiring 13.

The upper surface wiring 12 includes a bonding land (electrode pad) 12A and a plating extension line 12B. The lower surface wiring 13 includes ball lands 13A and 13B and an extension line 13C. The upper surface wiring 12 and the lower surface wiring 13 are each composed of a copper film. The upper surface wiring 12 has one end formed as the bonding land 12A and the other end connected to the via conductor layer 14A, which is electrically connected to the ball land 13B and to a solder ball 20. In other words, the bonding land 12A is electrically connected to the corresponding ball land 13B and solder ball 20 via the upper surface wiring 12 and the via conductor layer 14A. The wiring substrate 10 also has a structure such that the upper surface wiring 12 has one end formed as the bonding land 12A and the other end connected to the ball land 13A via the via conductor layer 14A and that the plating extension line 12B is connected to the bonding land 12A. The surface of the bonding land 12A that is exposed from the solder resist film 15 is overlaid with a plating film 21, and a wire 17 is connected to the bonding land 12A (upper surface wiring 12) via the plating film 21. The plating film 21 has a stacked structure composed of a nickel film and a gold film formed above the nickel film. The ball lands 13A and 13B exposed from the solder resist film 15 are overlaid with a plating film 21, and the solder ball 20 is connected to each of the ball lands 13A and 13B via the plating film 21.

Eliminating portions (etch-back trenches or openings) 16, i.e., openings of the solder resist film 15, are formed on the lower surface of the wiring substrate 10. At each eliminating portion 16, the lower surface of the core layer 11 of the wiring substrate 10 is exposed and extension lines 13C are also exposed from the side walls.

The semiconductor chip 1 included in the semiconductor device will then be described, referring to FIG. 1.

The semiconductor chip 1 has an almost quadrangular shape when seen in a plan view and is made of silicon (Si). The semiconductor chip 1 has a plurality of semiconductor elements (not depicted), such as MISFETs (Metal Insulator Semiconductor Field Effect Transistor), formed on the upper surface (main surface). On the upper surface of the semiconductor chip 1, a plurality of bonding pads 2 are staggered in two rows along each of four sides of the upper surface. Each bonding pad 2 is connected to the wire 17 via which the bonding pad 2 is electrically connected to the bonding land 12A.

The lower surface (back surface) of the semiconductor chip 1 is mounted on (bonded to) the upper surface of the wiring substrate 10 via an adhesive layer 19. The solder resist film 15 is interposed between the semiconductor chip 1 and the upper surface wiring 12 of the wiring substrate 10. As a result, the semiconductor chip 1 and the upper surface wiring 12 are insulated from each other via the solder resist film 15.

Each wire 17 is made of gold or copper, and the sealing material 18 is made of, for example, epoxy resin.

FIG. 2 is a plan view of the semiconductor device, showing arrangement of the solder balls 20 connected to the wiring substrate 10, the bonding lands 12A, the eliminating portions 16, and the semiconductor chip 1. The solder balls 20 and bonding lands 12A are indicated by solid lines to show their arrangement when seen in a top view of the wiring substrate 10. The semiconductor chip 1 is indicated by depicting its outline.

When seen in a plan view, the wiring substrate 10 is almost quadrangular and has four sides 10A, 10B, 10C, and 10D. On the wiring substrate 10, a first ball group, a second ball group, and a third ball group are formed, each of which is made up of a plurality of solder balls 20. The first ball group is located at the center of the wiring substrate 10 and is made up of a plurality of solder balls 20A arranged into a matrix manner. The second ball group is arranged around the first ball group at a distance of a first space area SR1 from the first ball group, and is made up of rows of solder balls 20B doubly arranged in a looped manner. The third ball group is arranged around the second ball group at a distance of a second space area SR2 from the second ball group, and is made up of rows of solder balls 20C fourfold arranged in a looped manner. For better understanding, FIG. 2 depicts the solder balls 20A of the first ball group, the solder balls 20B of the second ball group, and the solder balls 20C of the third ball group.

In the second space area SR2, a plurality of bonding lands 12A are arranged into a looped (frame-like) manner, and a plurality of eliminating portions 16 are also arranged into a looped manner.

The semiconductor chip 1 covers the first ball group and the first space area SR1 and also covers some of the solder balls 20B making up the second ball group. In the looped (frame-like) first space area SR1, a plurality of eliminating portions 16 are arranged into a looped (frame-like) manner. This means that the eliminating portions 16 formed in the first space area SR1 overlap the semiconductor chip 1 and are located under the semiconductor chip 1.

FIG. 3 depicts arrangement of upper surface wirings 12 in an A section of FIG. 2. In FIG. 3, ball lands 13A and 13B formed on the lower surface of the wiring substrate 10 are indicated by broken lines.

Each bonding land 12A and each ball land 13A or 13B corresponding thereto are electrically interconnected via an upper surface wiring 12, which is connected to the ball land 13A or 13B via a via conductor layer 14A. To the ball land 13A or 13B, a solder ball 20 (not depicted) is connected. The bonding land 12A connected to the ball land 13A is connected to a plating feeder line 12E via a plating extension line 12B, but the bonding land 12A connected to the ball land 13B is not connected to the plating feeder line 12E. The plating feeder line 12E is arranged outside the wiring substrate 10 serving as a product area and is thus located outside the side 10A of the wiring substrate 10. In a process of forming the plating film 21 of FIG. 1, a desired voltage for forming the plating film 21 is supplied to the bonding land 12A and to the ball land 13A via the plating feeder line 12E and the plating extension line 12B. As a result, the plating film 21 is formed on the bonding land 12A and on the ball land 13A.

FIG. 4 depicts arrangement of lower surface wirings 13 in the section A of FIG. 2. In the process of forming the plating film 21 of FIG. 1, the lower surface wirings 13 include ball lands 13A and 13B, extension lines 13C, and tie-lines 13D. The plurality of extension lines 13C extending from the plurality of ball lands 13A and 13B are connected to each other via the tie-lines 13D at an eliminating portion 16.

In the process of forming the plating film 21 of FIG. 1, a desired voltage for forming the plating film 21 is supplied by way of the plating feeder line 12E, the plating extension line 12B, the bonding land 12A, the upper surface wiring 12, the via conductor layer 14A, the ball land 13A, the extension line 13C, the tie-line 13D, the extension line 13C, the ball land 13B, the via conductor layer 14A, the upper surface wiring 12, and the bonding land 12A in order, as shown in FIGS. 3 and 4. As a result, the plating film 21 is formed on the ball land 13B and on the bonding land 12A. As shown in FIG. 1, the upper surface wiring 12 and the lower surface wiring 13 are covered with the solder resist film 15, but the surfaces of the ball lands 13A and 13B and bonding land 12A are exposed from the solder resist film 15. These exposed surfaces are overlaid with the plating film 21. The ball lands 13A and 13B thus have an SMD (Solder Mask Defined) structure in which their peripheries are covered with the solder resist film 15.

Following the formation of the plating film 21, the tie-lines 13D are eliminated from the eliminating portion 16 of FIG. 4. As a result, the plurality of ball lands 13A and 13B are electrically isolated from each other. At the eliminating portion 16, the solder resist film 15 covering the tie-lines 13D is also eliminated. This forms an opening on the solder resist film 15, and the core layer 11 of the wiring substrate 10 is exposed from the opening. The plating feeder line 12E is eliminated after the formation of the plating film 21 and before the above temperature cycle test.

As shown in FIG. 3, when seen in a plan view, the upper surface wirings 12 are formed on the upper surface of the wiring substrate 10 such that the upper surface wirings 12 overlap the eliminating portion 16 formed on the lower surface of the wiring substrate 10, that is, the upper surface wirings 12 cross the eliminating portion 16.

FIG. 5 is an enlarged view of the upper surface wiring 12 extending so as to cross the eliminating portion 16. FIG. 5 depicts only one upper surface wiring 12. The upper surface wiring 12 has one end formed as the bonding land 12A and the other end connected to the via conductor layer 14A. The upper surface wiring 12 has thin-wire portions 12F and a thick-wire portion 12G, and the thick-wire portion 12G is connected to the bonding land 12A via the thin-wire portion 12F, and the thick-wire portion 12G is also connected to the via conductor layer 14A via the thin-wire portion 12F. The wiring width W2 of the thick-wire portion 12G is larger than the wiring width W1 of the thin-wire portion 12F (W2>W1). The width W3 of the bonding land 12A is larger than the width of the thin-wire portion 12F (W3>W1). The part of the upper surface wiring 12 that crosses the eliminating portion 16 is the thick-wire portion 12G, whose length L2 is larger than the length L1 of the eliminating portion 16. The thick-wire portion 12G crossing the eliminating portion 16 successively extends on both sides of the eliminating portion 16 in the extending direction of the upper surface wiring 12. It is important that the part of upper surface wiring 12 crossing the eliminating portion 16 is the thick-wire portion 12G, which may be adjacent to the via conductor layer 14A (via 14) or bonding land 12A. When the thin-wire portion 12F has a plurality of wiring widths, the minimum of these wiring widths is determined to be the wiring width W1 of the thin-wire portion 12F. The wiring width means the size of the upper surface wiring 12 in the direction perpendicular to the extending direction of the upper surface wiring 12, and the length means the size of the upper surface wiring 12 or eliminating portion 16 in the extending direction of the upper surface wiring 12.

Increasing the width of the part of upper surface wiring 12 that crosses the eliminating portion 16 improves the strength of the upper surface wiring 12, thus preventing the breakage of the upper surface wiring 12 in the temperature cycle test.

The eliminating portion 16 is rectangular and has four arc corners with a desired radius R. In other words, the eliminating portion 16 is almost quadrangular. The eliminating portion 16 may have a circular shape. That is, it is essential that the eliminating portion 16 has a shape having no corner. Shaping the corners of the eliminating portion 16 into arcs reduces a stress applied to the eliminating portion 16 during the temperature cycle test, thus preventing the breakage of the upper surface wiring 12.

FIG. 6 depicts eliminating portions 16, 16a, 16b, 16c, and 16d, which are arranged on the lower surface of the wiring substrate 10, and the outline of the semiconductor chip 1 mounted on the upper surface of the wiring substrate 10. The eliminating portions 16, 16a, 16b, 16c, and 16d are indicated by solid lines. The semiconductor chip 1 has four sides 1A, 1B, 1C, and 1D that correspond to four sides 10A, 10B, 10C, and 10D of the wiring substrate 10, respectively. In FIG. 6, specific eliminating portions among the entire eliminating portions 16 are depicted as the eliminating portions 16a, 16b, 16c, and 16d.

As described above referring to FIG. 2, the plurality of eliminating portions 16, 16a, 16b, 16c, and 16d are arranged in the first space area SP1, in which the eliminating portions 16a and 16b are arranged along the side 1A of the semiconductor chip 1. In the direction along the side 1A, the eliminating portions 16a and 16b have their respective widths L3 and L4 and are separated from each other across a gap L5.

It is essential that the eliminating portions 16a and 16b are not successively and integrally arranged, but arranged so as to be separated from each other at a distance. It is also essential that the gap L5 between the eliminating portion 16a and the eliminating portion 16b is made larger than respective widths L3 and L4 of the eliminating portions 16a and 16b (L5>L3 and L4).

As a result of arranging the eliminating portions 16, 16a, and 16b separated from each other along the side 1A of the semiconductor chip 1, the width of each of the eliminating portions 16, 16a, and 16b is made small. A stress applied to the eliminating portions 16, 16a, and 16b is, therefore, reduced, which prevents the breakage of the upper surface wiring 12.

The upper surface wirings 12 of FIG. 5 are arranged so as to cross the eliminating portions 16, 16a, 16b, 16c, and 16d. The arrangement in which the thick-wire portions 12G of the upper surface wirings 12 cross the eliminating portions 16, 16a, 16b, 16c, and 16d prevents the breakage of the upper surface wirings 12. However, in the structure in which the eliminating portions 16, 16a, and 16b are arranged so as to be separated from each other along the side 1A of the semiconductor chip 1, for example, the upper surface wiring 12 does not always need to be provided with the thick-wire portion 12G.

The eliminating portions 16c and 16d are arranged along the side 1B such that respective distances from the eliminating portions 16c and 16d to the side 1B are different from each other. Specifically, it is essential that two eliminating portions 16c and 16d adjacent to each other are arranged such that their respective distances to the side 1B are different from each other.

By arranging the two eliminating portions 16c and 16d adjacent to each other such that their respective distances to the side 1B of the semiconductor chip 1 are different from each other (D1 # D2), each stress applied to the eliminating portion 16c or 16d acts in a different location in the direction perpendicular to the side 1B. As a result, each stress applied to the eliminating portion 16c or 16d turns out to be a reduced stress, in which case the breakage of the upper surface wiring 12 is prevented.

Proper combinations of the characteristics, such as the shapes and arrangement of the eliminating portions 16 and the shapes of the upper surface wirings 12 overlapping the eliminating portions allow more effective stress reduction and wire-breaking prevention.

As described above, the invention by the inventor has been specifically explained according to the embodiment; however, it is obvious that the invention is not limited to the embodiment and various changes may be made without departing from the scope of the invention.

What is claimed is:

1. A semiconductor device comprising:
a wiring substrate including a core layer having an upper surface and a lower surface, a first ball land and a second ball land formed on the lower surface of the core layer, a solder resist film partially covering the lower surface of the core layer, a first via conductor layer and a second via conductor layer penetrating the core layer and respectively connected to the first ball land and the second ball land, and a first upper surface wiring and a second upper surface wiring each formed on the upper surface of the core layer, the first upper surface wiring having one end formed as a bonding land and another end connected to the first via conductor layer, the second upper surface wiring having one end formed as a bonding land and another end connected to the second via conductor layer;
a semiconductor chip arranged on the wiring substrate and having a first bonding pad and a second bonding pad formed on a quadrangular main surface having a first side, a second side, a third side, and a fourth side;
a first wire connecting the first bonding pad to the respective bonding land of the first upper surface wiring, and a second wire connecting the second bonding pad to the respective bonding land of the second upper surface wiring;
a sealing material sealing the semiconductor chip and the first and second wires; and
a first solder ball and a second solder ball connected to the first and second ball lands, respectively,
wherein the solder resist film has a first eliminating portion and a second eliminating portion, each of which exposes the lower surface of the core layer,
wherein in a plan view, the first upper surface wiring extends across the first eliminating portion, and the second upper surface wiring extends across the second eliminating portion, and
wherein each of the first eliminating portion and the second eliminating portion has an almost quadrangular shape with arc corners.

2. The semiconductor device according to claim 1,
wherein each of the first and second upper surface wirings has a thin-wire portion having a first wiring width and a thick-wire portion having a second wiring width larger than the first wiring width,
wherein the thick-wire portion of the first upper surface wiring overlaps the first eliminating portion in a plan view, and
wherein the thick-wire portion of the second upper surface wiring overlaps the second eliminating portion in the plan view.

3. The semiconductor device according to claim 2,
wherein the first eliminating portion and the second eliminating portion are arranged in a line along the first side of the semiconductor chip in an extending direction of the first side.

4. The semiconductor device according to claim 3,
wherein, in the extending direction of the first side, a dimension of the first eliminating portion is smaller than a distance between the first eliminating portion and the second eliminating portion.

5. The semiconductor device according to claim 1,
wherein the solder resist film has a third eliminating portion which exposes the lower surface of the core layer, and
wherein the third eliminating portion has a circular shape.

6. The semiconductor device according to claim 1,
wherein the first and second eliminating portions overlap the semiconductor chip in a plan view.

7. The semiconductor device according to claim 1,
wherein a distance from the first side to the first eliminating portion is smaller than a distance from the first side to the second eliminating portion.

* * * * *